(12) United States Patent
Chen et al.

(10) Patent No.: US 7,956,631 B2
(45) Date of Patent: Jun. 7, 2011

(54) TEST SOCKET FOR TESTING SEMICONDUCTOR PACKAGE

(75) Inventors: Ke-Hao Chen, Tu-cheng (TW); Wen-Yi Hsieh, Tu-cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 113 days.

(21) Appl. No.: 12/381,420

(22) Filed: Mar. 10, 2009

(65) Prior Publication Data

US 2009/0224782 A1   Sep. 10, 2009

(30) Foreign Application Priority Data

Mar. 10, 2008   (TW) ............................. 97204002 U

(51) Int. Cl.
*G01R 31/00*   (2006.01)
(52) U.S. Cl. .......... 324/756.02; 324/754.08; 324/755.06
(58) Field of Classification Search .................. None
See application file for complete search history.

(56) References Cited

U.S. PATENT DOCUMENTS

| | | | | |
|---|---|---|---|---|
| 5,247,250 A | * | 9/1993 | Rios | 324/754 |
| 5,829,988 A | * | 11/1998 | McMillan et al. | 439/70 |
| 5,952,843 A | * | 9/1999 | Vinh | 324/761 |
| 6,575,767 B2 | * | 6/2003 | Satoh et al. | 439/71 |

* cited by examiner

*Primary Examiner* — Minh N Tang
(74) *Attorney, Agent, or Firm* — Andrew C. Cheng; Wei Te Chung; Ming Chieh Chang

(57) ABSTRACT

A test socket, adapted for connecting the semiconductor package and a printed circuit board comprises a base and a plurality of contacts received in the base. The base has a retaining board defining a plurality of first receiving holes and a positioning board defining a plurality of second receiving holes. The contacts has a contacting portion, an elastic portion and a retaining portion, the elastic portion is disposed between the retaining board and the positioning board and protruding rightward, and the contacting portion extends beyond the elastic portion and defines a acute angle with a horizontal line in a right hand before contacting with the semiconductor package to prevent the contacting portion from scratching with the left inner sidewall of the second receiving hole when pushed downward by the semiconductor package and rotating leftward.

14 Claims, 7 Drawing Sheets

TEST SOCKET FOR TESTING SEMICONDUCTOR PACKAGE

BACKGROUND OF THE INVENTION

1. Field of the Invention

The present invention relates to a test socket for testing semiconductor package, and more particularly, to a test socket having contact capable of reliably contacting with the semiconductor package.

2. Description of the Related Art

FIG. 1 discloses a typical contact of a typical socket, which is adapted for connecting a semiconductor package to a printed circuit board for performance test. The typical contact has an arch elastic portion 30' extending rightward, a contacting portion 31' bent from an end of the elastic portion 30' and extending upwardly, and a retaining portion 33' extending vertically and downwardly from the other end of the elastic portion 30'. The contacting portion 31' is used to interconnect with solder balls of the semiconductor package, the retaining portion 33' extends downwardly beyond the insulating housing to form a mounting portion 34' for contacting with the printed circuit board to establish an electrical connection between the semiconductor package and the printed circuit board.

The contacting portion 31' defines a right-hand angle with a horizontal line, regarded as a1 which is slight greater than 90°, when the semiconductor package moves downwardly, a free end of the contacting portion 31' is pressed downwardly by the semiconductor package, and the elastic portion 30' of the typical contact is then compressed. The contacting portion 31' is located in a left side of an extended line of the retaining portion 33', a downward force brought by the semiconductor package forces the contacting portion 31' of the typical contact to rotate leftward, the contacting portion 31' slides leftward, then the angle a1 become large, the contacting portion 31' of the typical contact will easily scratch an inner sidewall of a receiving hole of an insulating housing which receives the typical contact therein. As a result, a constant and reliable interconnection between the contacting portion 31' of the conventional contact and the solder balls of the semiconductor package can not be ensured, rendering poor and ineffective test of the semiconductor package Hence, it is required to improve the disadvantages of the above sockets.

SUMMARY OF THE INVENTION

An object of the invention is to provide a test socket which has contact capable of reliably contacting with a semiconductor package.

To achieve the above-mentioned object, a test socket, adapted for connecting the semiconductor package and a printed circuit board comprises a base and a plurality of contacts received in the base. The base has a retaining board defining a plurality of first receiving holes and a positioning board defining a plurality of second receiving holes. The contact has a contacting portion, an elastic portion and a retaining portion. The elastic portion is disposed between the retaining board and the positioning board and protrudes rightward at a center part thereof to form an upper arm and a lower arm. The contacting portion extends from the upper arm and inserts into the second receiving hole of the positioning board, the retaining portion extends downwardly and vertically to engage with the first receiving hole of the retaining board. The contacting portion defines a acute angle with a horizontal line in a right hand before contacting with the semiconductor package.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiments of the present invention.

Figure 1:
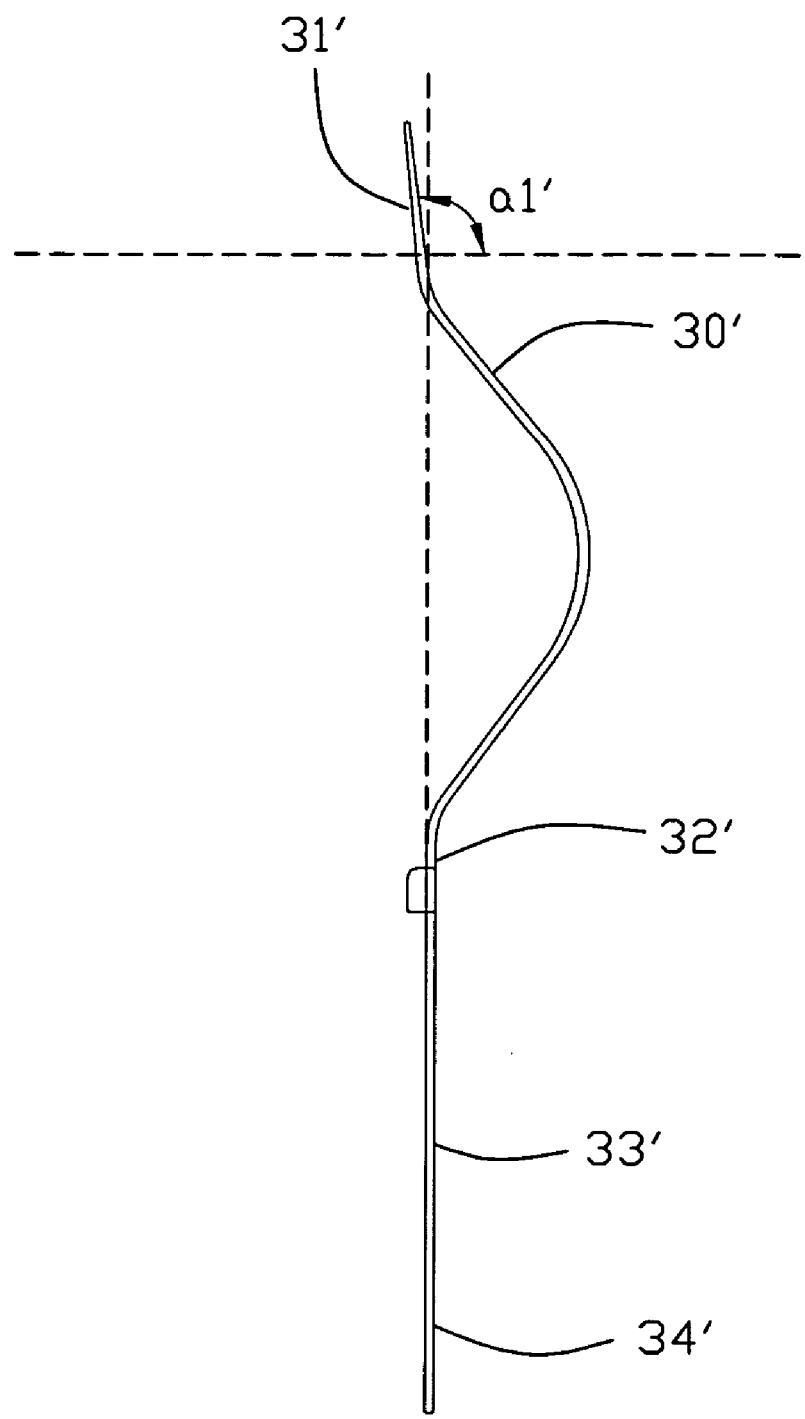
FIG. 1 is a perspective view of a typical contact in a test socket.
Figure 2:
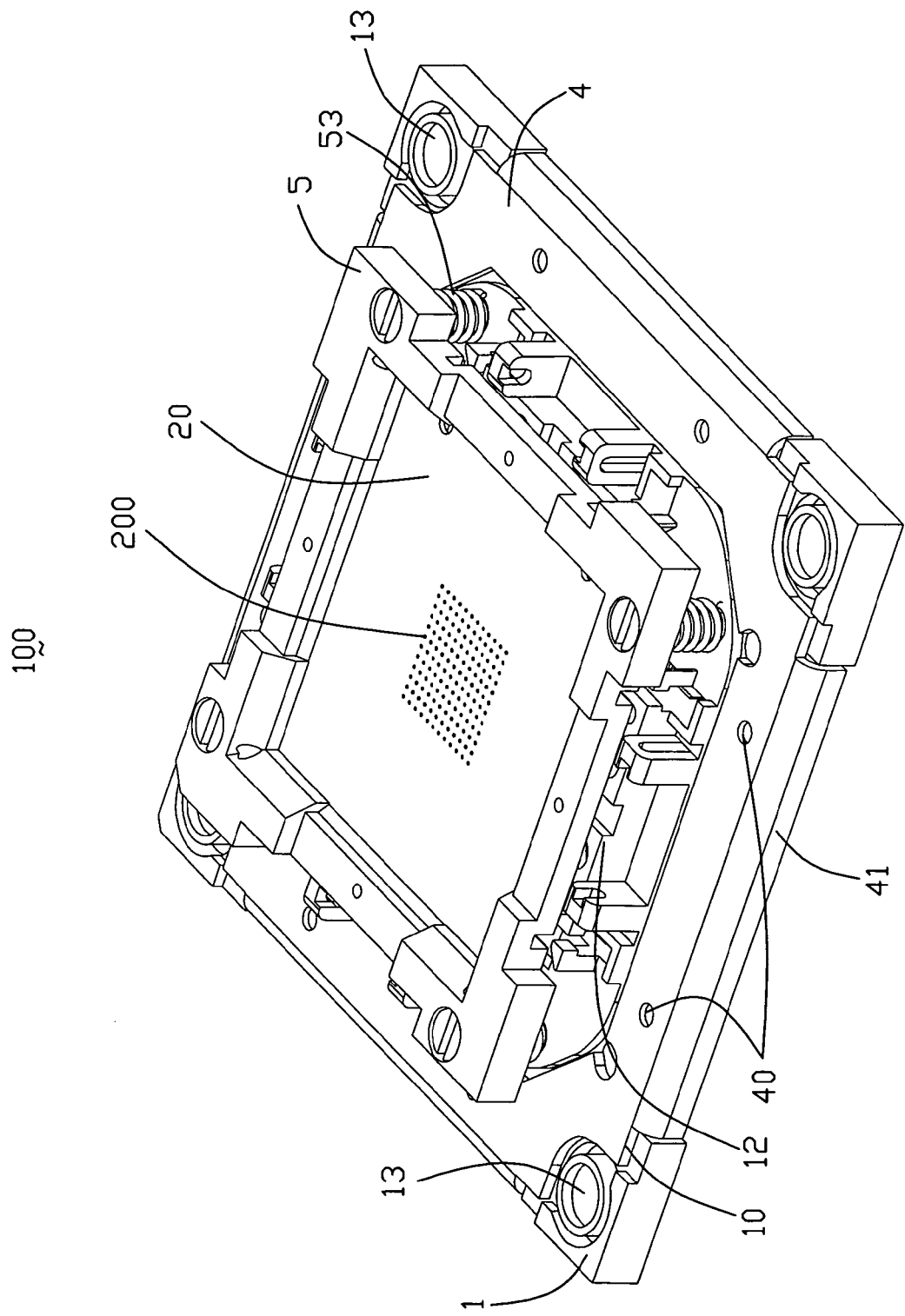
FIG. 2 is an assembled, perspective view of a test socket with a semiconductor package in accordance with a preferred embodiment of present invention.

Referring to FIGS. 1-2, a test socket 100 for testing a semiconductor package 6, comprises a base 1 mounted above the printed circuit board (not shown), a plurality of contacts 3 received in the base 1, a reinforcing member 4 and a frame 5 mounted upon the base 1 and the reinforcing member 4.

Referring to FIGS. 1 and 2, the base 1 is horizontally disposed above the printed circuit board (not shown) and defines a receiving space 10. The base 1 is formed with a plurality of positioning member 12 on center parts of four sides thereof near the receiving space 10. The base 1 has a retaining board 21 received in a bottom of the receiving space 10 and a positioning board 20 disposed on a top of the receiving space 10. The retaining board 21 is received in the receiving space 10 from a bottom side of the base 1. The retaining board 21 defines a plurality of first receiving holes 210. The base 1 defines a plurality of through holes 13 on four corners thereof and is mounted on the printed circuit board (not shown) by bolts (not shown). The base 1 defines a plurality of first perforations 14 passing through the four sides thereof, respectively and a plurality of recesses 16 recessed inwardly from outside surfaces of the four sides thereof, respectively.

The reinforcing member 4 is stamped from a metal piece and defines an opening (not labeled) in a center thereof and a plurality of second perforations 40. A plurality of fasteners 15 engage with the first and the second perforations 14, 40 and rivet the base 1 and the reinforcing member 4 together. The reinforcing member 4 is formed with four lateral sidewalls 41 bent downwardly from four sides thereof and received in the recesses 16 of the base 1.

The frame 5 is mounted upon the base 1 and the reinforcing member 4, the frame 5 defines four circular holes 51 on four corners thereof, a screw haulm 520 of a bolt 52 together with a spring 53 surrounding the screw haulm 520 passes through the circular hole 51 of the frame 5 to connect the frame 5 and the base 1 together. The positioning board 20 is positioned between the retaining board 21 and the frame 5, and has a plurality of second receiving holes 200 in a center thereof.

Figure 3:
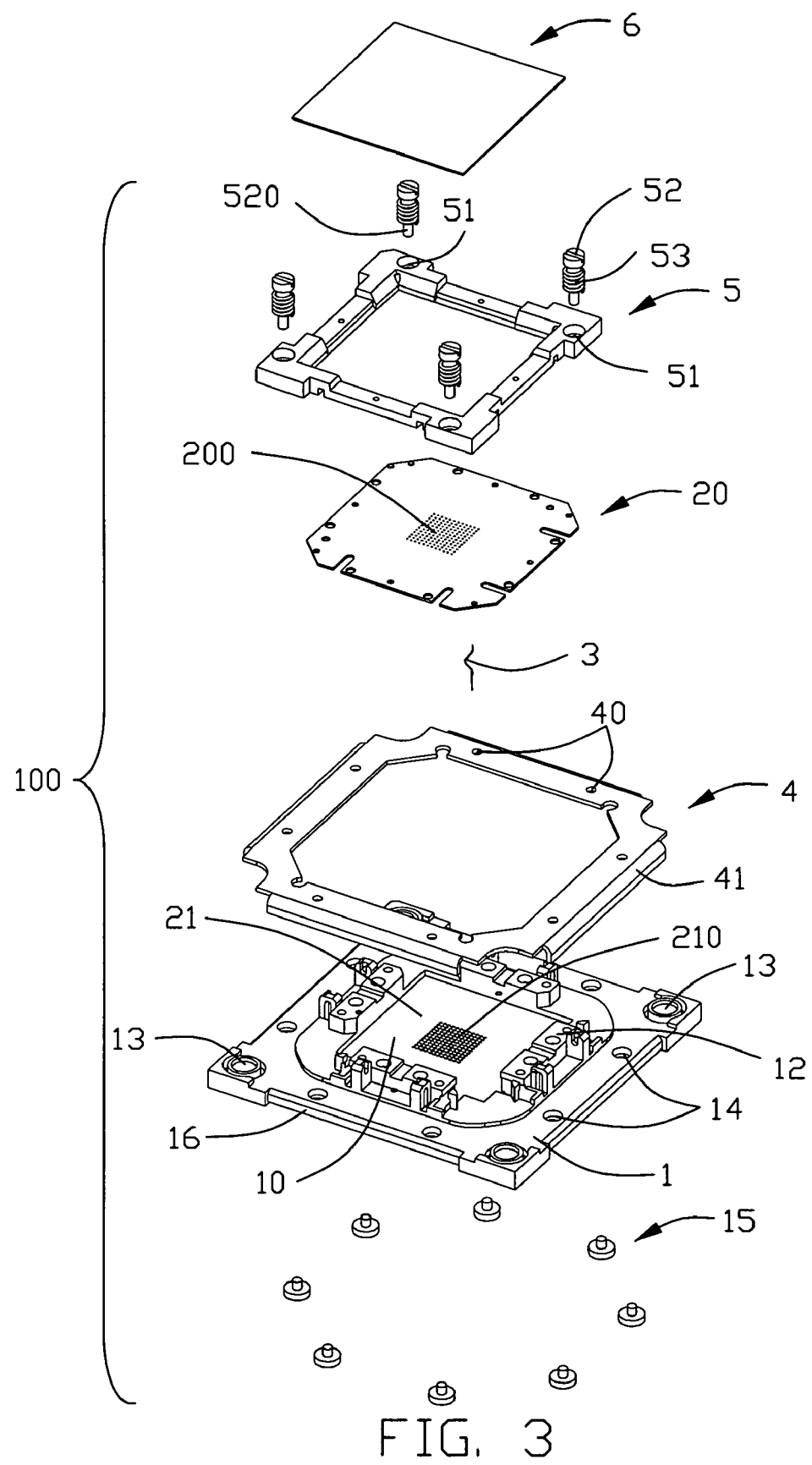
FIG. 3 is an exploded, perspective view of the test socket in FIG. 2.
Figure 4:
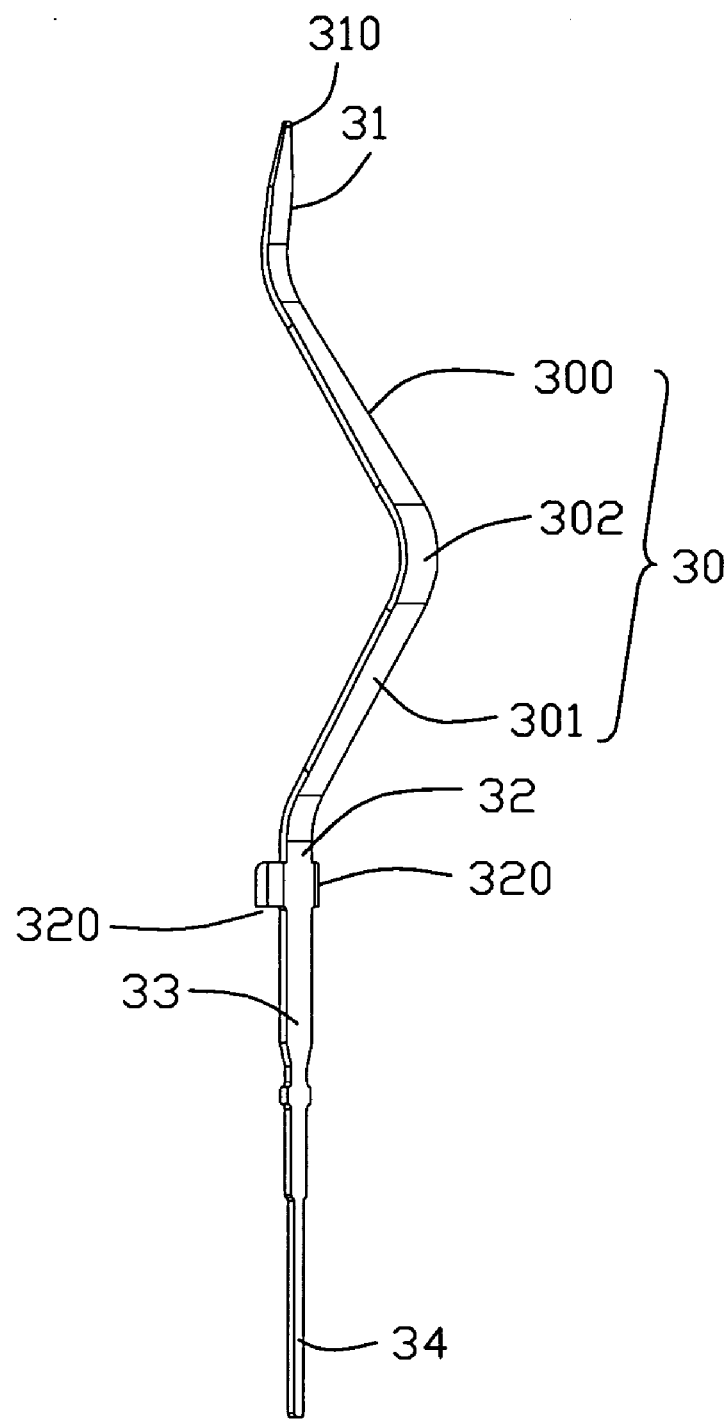
FIG. 4 is a perspective view of a contact of the test socket in FIG. 3.

Referring to FIG. 3 and FIG. 4, the contacts 3 has an elastic portion 30 protruding rightward. The elastic portion 30 comprises an upper arm 300, a lower arm 301 and an arch linking portion 302 connecting the upper arm 300 and the lower arm 302. The upper arm 300 and the lower arm 301 of the elastic arm 30 define an obtuse angle therebetween. A contacting portion 31 is bent upwardly and rightward from an end of the upper arm 300 of the elastic portion 30, the contacting portion 31 defines a acute angle with a horizontal line in right hand, regarded as a. The contacting portion 31 has a gradually narrow width and forms a pressing portion 310 at a free end thereof to contact with a solder ball 60 on a bottom side of the semiconductor package 6. The elastic portion 30 has a latching portion 32 bent downwardly from a bottom end of the lower arm 301, the latching portion 32 is formed with a pair of latching arms 320 extending from two opposite sides thereof. A retaining portion 33 extends vertically and downwardly to form a mounting portion 34.

Figure 5:
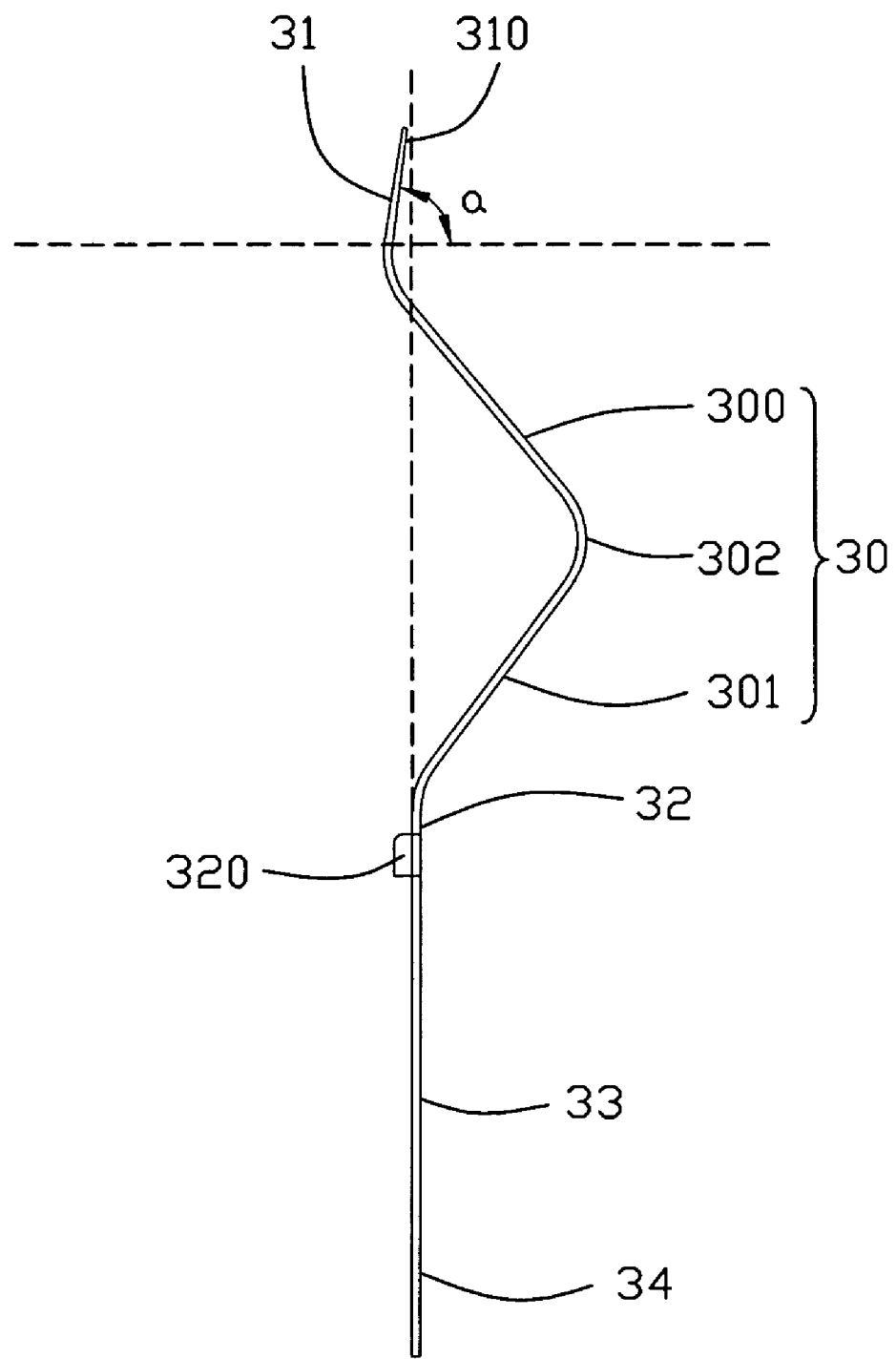
FIG. 5 is a left plan view of the contact in FIG. 4.

Referring to FIG. 1 and FIG. 2, and conjoined with FIG. 5, the base 1 of the test socket 100 connect with the reinforcing member 4 by the positioning members 15, and connect with the frame 5 by the bolts 52. The positing board 20 is assembled under the frame 5 and above the retaining board 21 and received in the receiving space 10. The contact 3 is retained between the positioning board 20 and the retaining board 21, the contacting portion 31 of the contact 3 is received in the second receiving hole 200 of the positioning board 20; the latching arms 320 of the latching portion 32 engage with an upper side of the first receiving hole 210 of the retaining board 21; the retaining portion 33 inserts into and is retained in the first receiving hole 210 of the retaining board 21; and the mounting portion 34 of the contact 3 extends beyond a bottom face of the base 1 to electrically contact with the printed circuit board (not shown).

Figure 6:
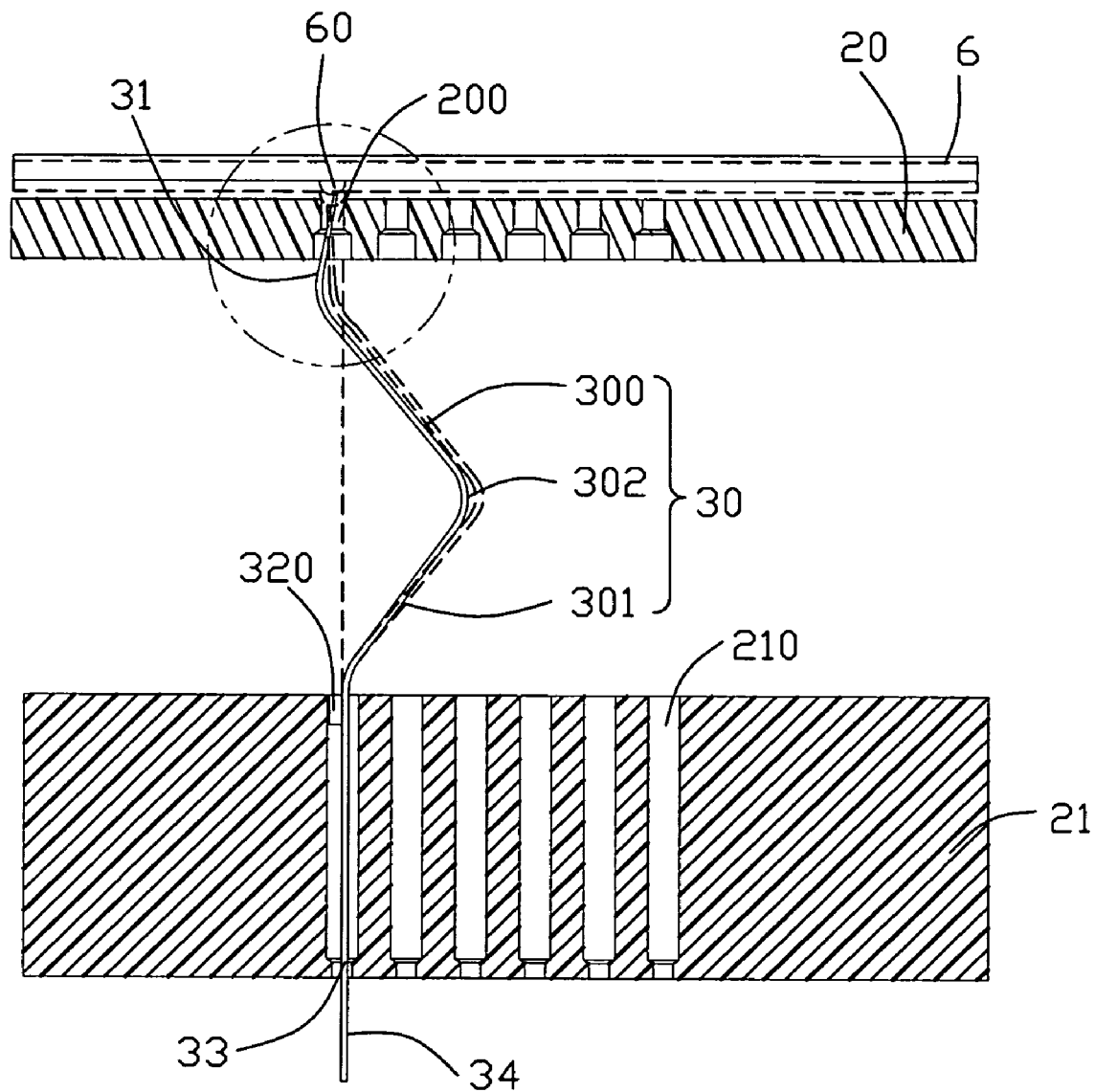
FIG. 6 is a section view of a part of the test socket to show different positions of the contact, before and after the semiconductor package is assembled on the test socket.
Figure 7:
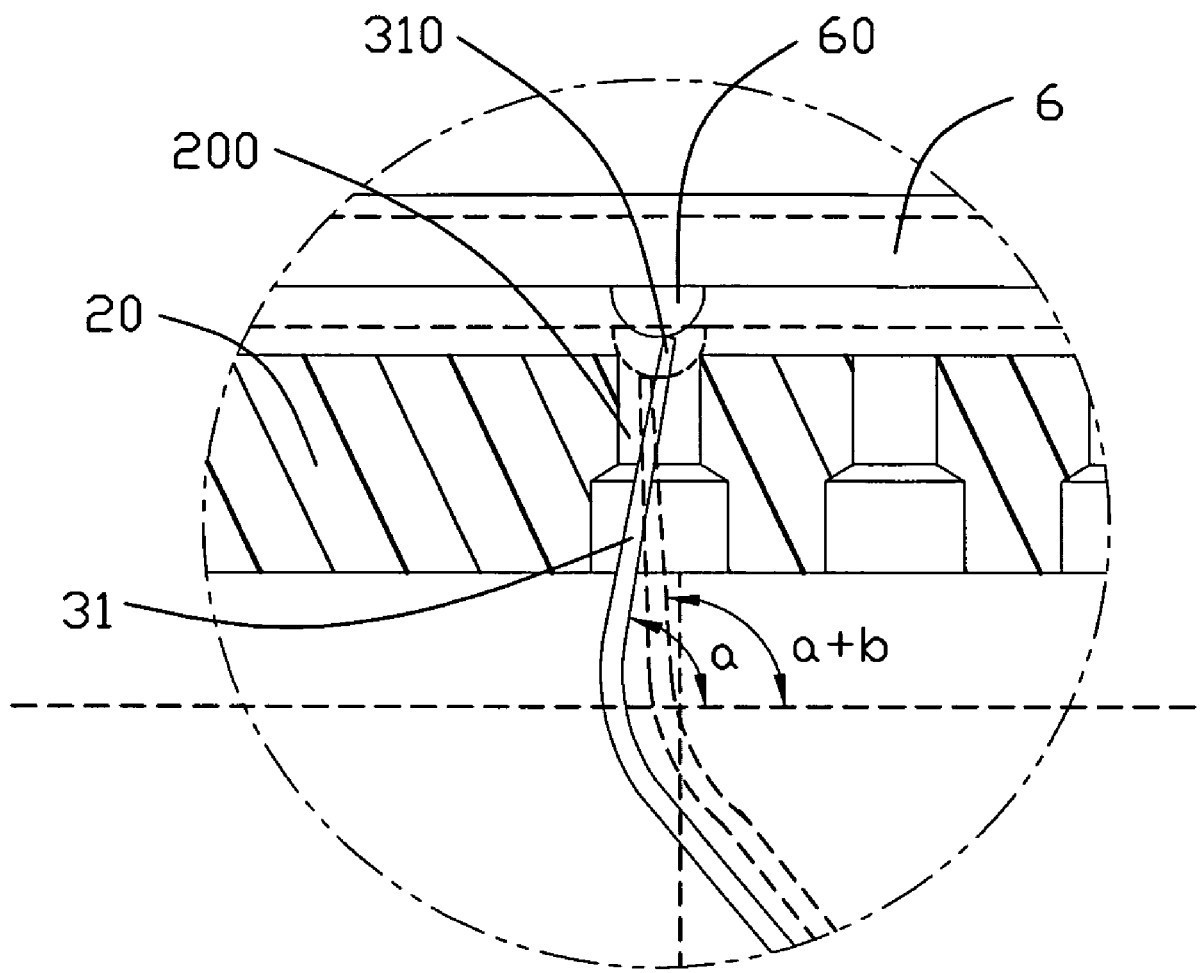
FIG. 7 is an enlarged view, showing a circular part in FIG. 6.

Referring to FIGS. 5 and 6, and conjoined with FIG. 4, when the semiconductor package 6 is disposed upon the test socket 100 and pushed downwardly by a plurality of pressing members (not shown), which is pivotally assembled to the positioning member 12 of the base 1 to press the semiconductor package 6 downwardly, the solder balls 60 of the semiconductor package 6 are received in the second receiving holes 200 of the positioning board 20 and contact with the pressing portion 310 of the contacting portion 31 of the contact 3. As a result, the semiconductor package 6 electrically contacts with the contacts 3.

When the pressing portion 310 of the contacting portion 31 is pressed downwardly by the solder balls 60 of the semiconductor package 6, the elastic portion 30 is compressed and elastically deform, the upper arm 300 and the lower arm 301 are reaching toward each other, and the angle between the upper arm 300 and the lower arm 301 become smaller.

Since the contacting portion 31 is located on a left side of the retaining portion 33 which is fixed to the retaining board 21, so the downward force of the semiconductor package 6 on the pressing portion 310 will create a momentum to the contacting portion 31, the momentum will bring the contacting portion 31 to rotate leftward till the downward force of the semiconductor package 6 balances with a restoration force of the deformed contact 3. The momentum will cause the contacting portion 31 to rotate angular distance, regarded as b, so a right-hand angle defined by the contacting portion 31 and the horizontal line changes to a+b, which is larger than 90°, so the contacting portion 31 defines another angle with a vertical line, regarded as n, n=a+b−90, since a<90, n<b, so the contacting portion 31 of the contact 3 rotates leftward at a small angle n and will not scratch a left inner sidewall of the first receiving hole 200, and the semiconductor package 6 can reliably electrically contact the contact 3.

Compared with typical socket, if the downward force of the semiconductor package 6 is decided, the angle b is decided, since the angle a' in typical contact is an obtuse angle, so the contacting portion 31' pressed by the semiconductor package 6 defines an angle with the vertical line, regarded as n', n'=a'+b−90, and n'>b. However, the angle of the contacting portion 31 of contact 3 in accordance in present invention is a acute angle a, so the angle n<b, and the contacting portion 31 will not easily scratch the left inner sidewall of the receiving hole 200. In fact, since the angle a is a acute angle, the free end of the contacting portion 31 is closer to the extended line of the retaining portion 33, so the arm of force of the momentum is shortened, the momentum is also smaller that causes the angle b become smaller than that of the convention contact, and the angle n is much smaller than n', too.

In additional, the angle a is best designed between 70° to 90° and can not be too small to prevent the contacting portion 31 from scratching a right inner sidewall of the receiving hole 200. This design will make the contact 3 has substantial same angles with the vertical line before and after the semiconductor package 6 is disposed on the test socket, that means an angle 90—a substantially equal with the angle n.

It is noted that the root section (not labeled) of the elastic portion 32 from which the elastic portion 32 extends upwardly from the retaining board 21, is positioned adjacent to the latching portion 32 under condition that the contacting portion 31 and the elastic portion 30 are essentially located by two sides of the root section so as to assure that deflection of the contacting portion 31 rotates in the expected leftward way as shown in FIG. 6.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A test socket, for connecting the semiconductor package and a printed circuit board comprising:
   a base having a retaining board defining a plurality of first receiving holes and a positioning board defining a plurality of second receiving holes; and
   a plurality of contacts received in the base, the contact having a contacting portion, an elastic portion and a retaining portion, the elastic portion disposed between the retaining board and the positioning board and protruding rightward at a center part thereof to form an upper arm and a lower arm, the contacting portion extending from the upper arm and inserting into the second receiving hole of the positioning board, the retaining portion extending downwardly and vertically to engage with the first receiving hole of the retaining board, the contacting portion defining an acute angle with a horizontal line in a right hand before contacting with the semiconductor package, and rotating leftward relative to a vertical line when being depressed by a downward force.

2. The test socket as described in claim 1, wherein the acute angle is best designed between 70° to 90°.

3. The test socket as described in claim 2, wherein the contacting portion rotates leftward and defines an obtuse angle with the horizontal line in a right hand when pushed downwardly by the semiconductor package.

4. The test socket as described in claim 1, wherein the contacting portion has a gradually narrow width toward a free end thereof and is formed with a pressing portion for contacting with the semiconductor package.

5. The test socket as described in claim 4, wherein the contacting portion is originally located in a left side of an extended line of the retaining portion, then the semiconductor package presses on the pressing portion of the contacting portion and creates a momentum to the contacting portion, which rotates the contacting portion leftward till the downward force of the semiconductor package equal with the restoration force of the contact.

6. A socket for use with an IC package, comprising:
a lower retaining board and an, upper positioning board spaced from each other with a space therebetween, said upper positioning board defining a plurality of through holes therein and an upper face for confronting said IC package;
a plurality of contacts retaining on the retaining board, each of said contacts including a curved elastic portion located in said space, a contacting portion extending upwardly from a tip of the elastic portion and into the corresponding through hole for being downwardly depressed by the IC package; wherein
said contacting portion extends upwardly from the elastic portion along a first oblique direction with regard to the positioning board in a free status while being deflected and rotated toward a vertical direction with regard to the positioning board once downwardly depressed by the IC package.

7. The socket as claimed in claim 6, wherein said contacting portion is further deflected away from the elastic portion toward a second oblique direction opposite to said first oblique direction with regard to the vertical direction.

8. The socket as claimed in claim 7, wherein said second oblique direction faces away from the curved elastic portion in a top view.

9. The socket as claimed in claim 6, wherein the contacting portion and the elastic portion are located at opposite sides of a root section of the elastic portion via which the elastic portion extends upward from the retaining board.

10. The socket as claimed in claim 9, wherein said root section is adjacent to a latching section of the contact which fixes the contact to the retaining board.

11. The socket as claimed in claim 6, when said first oblique direction faces toward the curved elastic portion in a top view.

12. A socket for use with an IC package, comprising:
a lower retaining board and an upper positioning board spaced from each other with a space therebetween, said upper positioning board defining a plurality of through holes therein and an upper face for confronting said IC package;
a plurality of contacts retaining on the retaining board, each of said contacts including a curved elastic portion located in said space, a contacting portion extending upwardly from the elastic portion and into the corresponding through hole for being downwardly depressed by the IC package; wherein
said elastic portion defines a mot section from which said elastic portion extends upwardly away from the retaining board under condition that the contacting portion and the elastic portion are located by two sides of the root section in a top view, and the contacting portion upwardly extends from the elastic portion in an oblique direction with regard to the positioning board in a free status before being downwardly depressed by the IC package; wherein
said oblique direction faces toward the curved elastic portion in said top view.

13. The socket as claimed in claim 12, wherein the root section is position close to a latching portion of the contact which fixes the contact in the retaining board.

14. The socket as claimed in claim 13, wherein said contacting portion is deflected away from the elastic portion during being downwardly depressed by the IC package.

* * * * *